United States Patent
Borthakur et al.

(10) Patent No.: US 10,165,211 B1
(45) Date of Patent: Dec. 25, 2018

(54) IMAGE SENSORS WITH OPTICALLY BLACK PIXELS

(71) Applicant: SEMICONDUCTOR COMPONENTS INDUSTRIES, LLC, Phoenix, AZ (US)

(72) Inventors: Swarnal Borthakur, Boise, ID (US); Loriston Ford, Nampa, ID (US); Bartosz Piotr Banachowicz, San Jose, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/683,201

(22) Filed: Aug. 22, 2017

(51) Int. Cl.
| | |
|---|---|
| *H04N 5/369* | (2011.01) |
| *H04N 5/361* | (2011.01) |
| *H04N 5/378* | (2011.01) |
| *H01L 27/146* | (2006.01) |

(52) U.S. Cl.
CPC ..... *H04N 5/3696* (2013.01); *H01L 27/14623* (2013.01); *H01L 27/14645* (2013.01); *H04N 5/361* (2013.01); *H04N 5/378* (2013.01); *H01L 27/14621* (2013.01); *H01L 27/14627* (2013.01)

(58) Field of Classification Search
CPC ...... H04N 5/3696; H04N 5/378; H04N 5/361; H01L 27/14645; H01L 27/14623; H01L 27/14621; H01L 27/14627

USPC ........ 348/294–324; 250/208.1; 257/290–292
See application file for complete search history.

(56) References Cited

U.S. PATENT DOCUMENTS

| | | | |
|---|---|---|---|
| 7,859,072 B2* | 12/2010 | Han | H01L 27/14621 257/431 |
| 2008/0217712 A1 | 9/2008 | Rossi et al. | |
| 2011/0149137 A1* | 6/2011 | Koike | H01L 27/14603 348/308 |
| 2012/0043636 A1 | 2/2012 | Nagata | |
| 2015/0163421 A1 | 6/2015 | Shigeta | |

* cited by examiner

*Primary Examiner* — Yogesh K Aggarwal
(74) *Attorney, Agent, or Firm* — Treyz Law Group, P.C.; Tianyi He

(57) ABSTRACT

An image sensor may include optically black pixels for obtaining dark current measurements. The image sensor may include dummy pixels between the active pixel array and the optically black pixels. Light incident upon the dummy pixels may be redirected to the optically black pixels, causing inaccurate dark current measurements. Light-blocking structures may be provided in the dummy pixels to prevent light from reaching the optically black pixels. A grid of openings may be formed in the active pixel array and the dummy pixel area. The grid may be filled with color filters in the active area and light-blocking elements in the dummy pixel area. The dummy pixel area may include a single opening in the grid in which a single light-blocking element that covers multiple dummy pixel photodiodes is formed. Light-blocking structures in the dummy pixel area may extend over the optically black pixels.

20 Claims, 10 Drawing Sheets

IMAGE SENSORS WITH OPTICALLY BLACK PIXELS

BACKGROUND

This application relates to image sensors, and more particularly, image sensors that have optically black pixels.

Image sensors are commonly used in electronic devices such as cellular telephones, cameras, and computers to capture images. In a typical arrangement, an electronic device is provided with an array of image pixels arranged in pixel rows and pixel columns. The image pixels contain a photodiode for generating charge in response to light. Circuitry is commonly coupled to each pixel column for reading out image signals from the image pixels.

Image sensors of this type may include optically black pixels arranged around the periphery of the array of image pixels that are used to generate image signals. The image sensor may be provided with light-blocking structures over the optically black pixels to help prevent light from reaching the optically black pixels and causing the optically black pixels to generate electrical charge in response to the light. In this way, optically black pixels may be used to make dark current measurements that can be used for noise compensation in image signals and for image sensor calibration operations.

Dummy pixels may be provided between the array of image pixels and the optically black pixels to allow for manufacturing tolerances. However, light that enters the image sensor through the dummy pixels may be redirected to the optically black pixels, causing the optically black pixels to generate current in response to incident light. This can produce inaccurate dark current measurements and lead to improper noise compensation and calibration.

It would therefore be desirable to provide image sensors with light-blocking structures for optically black pixels.

DETAILED DESCRIPTION

Electronic devices such as digital cameras, computers, cellular telephones, and other electronic devices may include image sensors that gather incoming light to capture an image. The image sensors may include arrays of pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the pixels and readout circuitry for reading out image signals corresponding to the electric charge generated by the photosensitive elements.

Figure 1:
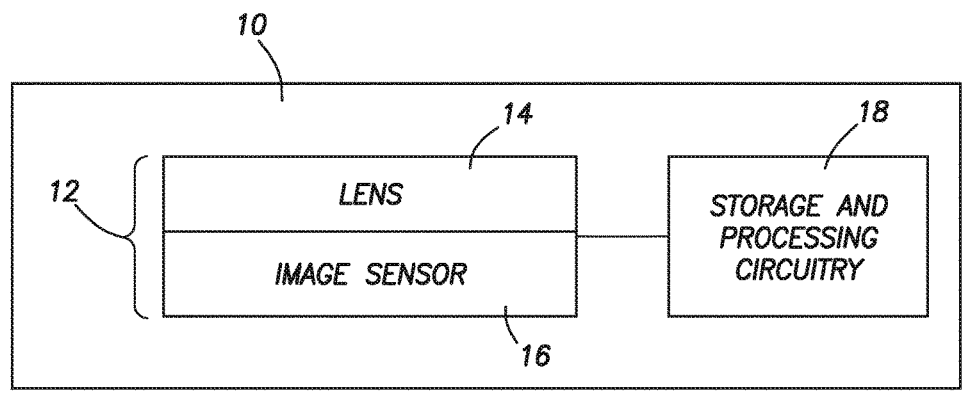
FIG. 1 is a diagram of an illustrative electronic device having processing circuitry and an image sensor with light-blocking structures for optically black pixels in accordance with an embodiment of the present invention.

FIG. 1 is a diagram of an illustrative imaging system such as an electronic device that uses an image sensor to capture images. Electronic device 10 of FIG. 1 may be a portable electronic device such as a camera, a cellular telephone, a tablet computer, a webcam, a video camera, a video surveillance system, an automotive imaging system, a video gaming system with imaging capabilities, or any other desired imaging system or device that captures digital image data. Camera module 12 may be used to convert incoming light into digital image data. Camera 12 may include one or more lenses 14 and one or more corresponding image sensors 16. Lenses 14 may include fixed and/or adjustable lenses and may include microlenses formed on an imaging surface of image sensor 16. During image capture operations, light from a scene may be focused onto image sensor 16 by lenses 14. Image sensor 16 may include circuitry for converting analog pixel data into corresponding digital image data to be provided to storage and processing circuitry 18. If desired, camera module 12 may be provided with an array of lenses 14 and an array of corresponding image sensors 16.

Storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18 (e.g., using an image processing engine on processing circuitry 18, using an imaging mode selection engine on processing circuitry 18, etc.). Processed image data may, if desired, be provided to external equipment (e.g., a computer, external display, or other device) using wired and/or wireless communications paths coupled to processing circuitry 18.

Figure 2:
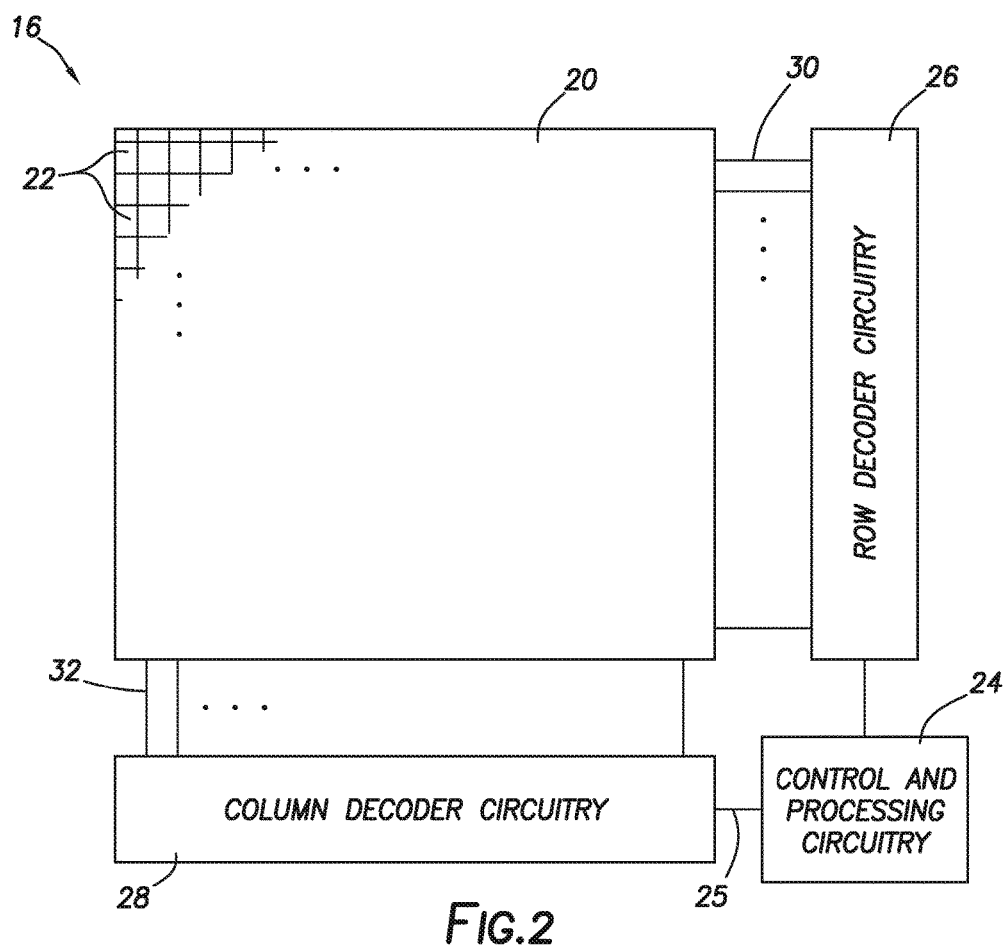
FIG. 2 is a diagram of an illustrative pixel array and associated readout circuitry in accordance with an embodiment of the present invention.

As shown in FIG. 2, image sensor 16 may include a pixel array 20 containing pixels 22 arranged in rows and columns and control and processing circuitry 24 (which may include, for example, image signal processing circuitry). Array 20 may contain, for example, hundreds or thousands of rows and columns of pixels 22. Control circuitry 24 may be coupled to row control circuitry 26 and image readout circuitry 28 (sometimes referred to as column control circuitry, readout circuitry, processing circuitry, or column decoder circuitry). Row control circuitry 26 may receive row addresses from control circuitry 24 and supply corresponding row control signals such as reset, row-select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Image readout circuitry 28 may receive image signals (e.g., analog pixel values generated by pixels 22) over column lines 32. Image readout circuitry 28 may include sample-and-hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Image readout circuitry 28 may supply digital pixel data to control and processing circuitry 24 and/or processor 18 (FIG. 1) over path 25 for pixels in one or more pixel columns.

If desired, a color filter array may be formed over photosensitive regions in array 20 so that a desired color filter element in the color filter array is formed over an upper surface of the photosensitive region of an associated pixel 22. A microlens may be formed over an upper surface of the color filter array to focus incoming light onto the photosensitive region associated with that pixel 22. Incoming light may be focused onto the photosensitive region by the microlens and may pass through the color filter element so that only light of a corresponding color is captured at the photosensitive region. If desired, an optional masking layer may be interposed between the color filter element and the microlens for one or more pixels 22 in array 20. In another suitable arrangement, an optional masking layer may be interposed between the color filter element and the photosensitive region for one or more pixels 22 in array 20. The masking layers may include metal masking layers or other filtering layers that block a portion of the image light from being received at the photosensitive region. The masking layers may, for example, be provided to some pixels 22 to adjust the effective exposure level of corresponding pixels 22 (e.g., pixels 22 having masking layers may capture less light relative to image pixels 22 without masking layers). If desired, pixels 22 may be formed without any masking layers.

If desired, pixels 22 in array 20 of FIG. 2 may be provided with an array of color filter elements that each pass one or more colors of light. All or some of pixels 22 may be provided with a color filter element. Color filter elements for pixels 22 may be red color filter elements (e.g., photoresist material or interference/dichroic/thin-film filter material that passes red light while reflecting and/or absorbing other colors of light), blue color filter elements (e.g., photoresist material that passes blue light while reflecting and/or absorbing other colors of light), and/or green color filter elements (e.g., photoresist material that passes green light while reflecting and/or absorbing other colors of light). Color filter elements may also be configured to filter light that is outside the visible human spectrum. For example, color filter elements may be configured to filter ultraviolet or infrared light (e.g., a color filter element may only allow infrared light or ultraviolet light to reach the photodiode). Color filter elements may configure image pixel 22 to only detect light of a certain wavelength or range of wavelengths (sometimes referred to herein as a wavelength band) and may be configured to allow multiple wavelengths of light to pass while blocking light of certain other wavelengths (for example, light having a wavelength that corresponds to a certain visible color and/or an infrared or ultraviolet wavelength).

Color filter elements that pass two or more colors of light (e.g., two or more colors of light selected from the group that includes red light, blue light, and green light) are sometimes referred to herein as "broadband" filter elements. For example, yellow color filter elements that are configured to pass red and green light and clear color filter elements that are configured to pass red, green, and blue light may be referred to herein as broadband filter elements or broadband color filter elements. Magenta color filter elements that are configured to pass red and blue light may be also be referred to herein as broadband filter elements or broadband color filter elements. Similarly, image pixels that include a broadband color filter element (e.g., a yellow, magenta, or clear color filter element) and that are therefore sensitive to two or more colors of light (e.g., that capture image signals in response to detecting two or more colors of light selected from the group that includes red light, blue light, and green light) may sometimes be referred to herein as broadband pixels or broadband image pixels. Image signals generated by broadband image pixels may sometimes be referred to herein as broadband image signals. Broadband image pixels may have a natural sensitivity defined by the material that forms the broadband color filter element and/or the material that forms the image sensor pixel (e.g., silicon). In another suitable arrangement, broadband image pixels may be formed without any color filter elements. The sensitivity of broadband image pixels may, if desired, be adjusted for better color reproduction and/or noise characteristics through use of light absorbers such as pigments. In contrast, "colored" pixel may be used herein to refer to image pixels that are primarily sensitive to one color of light (e.g., red light, blue light, green light, or light of any other suitable color). Colored pixels may sometimes be referred to herein as narrowband image pixels because the colored pixels have a narrower spectral response than the broadband image pixels.

If desired, narrowband pixels and/or broadband pixels that are not configured to be sensitive to infrared light may be provided with color filters incorporating absorbers of NIR radiation. Color filters that block near-infrared light may minimize the impact of infrared light on color reproduction in illuminants containing both visible and infrared radiation.

As an example, image sensor pixels such as the image pixels in array 20 may be provided with a color filter array which allows a single image sensor to sample red, green, and blue (RGB) light using corresponding red, green, and blue image sensor pixels arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. In another suitable example, the green pixels in a Bayer pattern are replaced by broadband image pixels having broadband color filter elements. In another suitable example, a monochrome image sensor 16 may be provided by providing all of the pixels 22 in array 20 with clear material (e.g., material that passes at least red, blue, and green light) instead of color filters that block some wavelengths while passing others. These examples are merely illustrative and, in general, color filter elements of any desired color and in any desired pattern may be formed over any desired number of image pixels 22.

Figure 3:
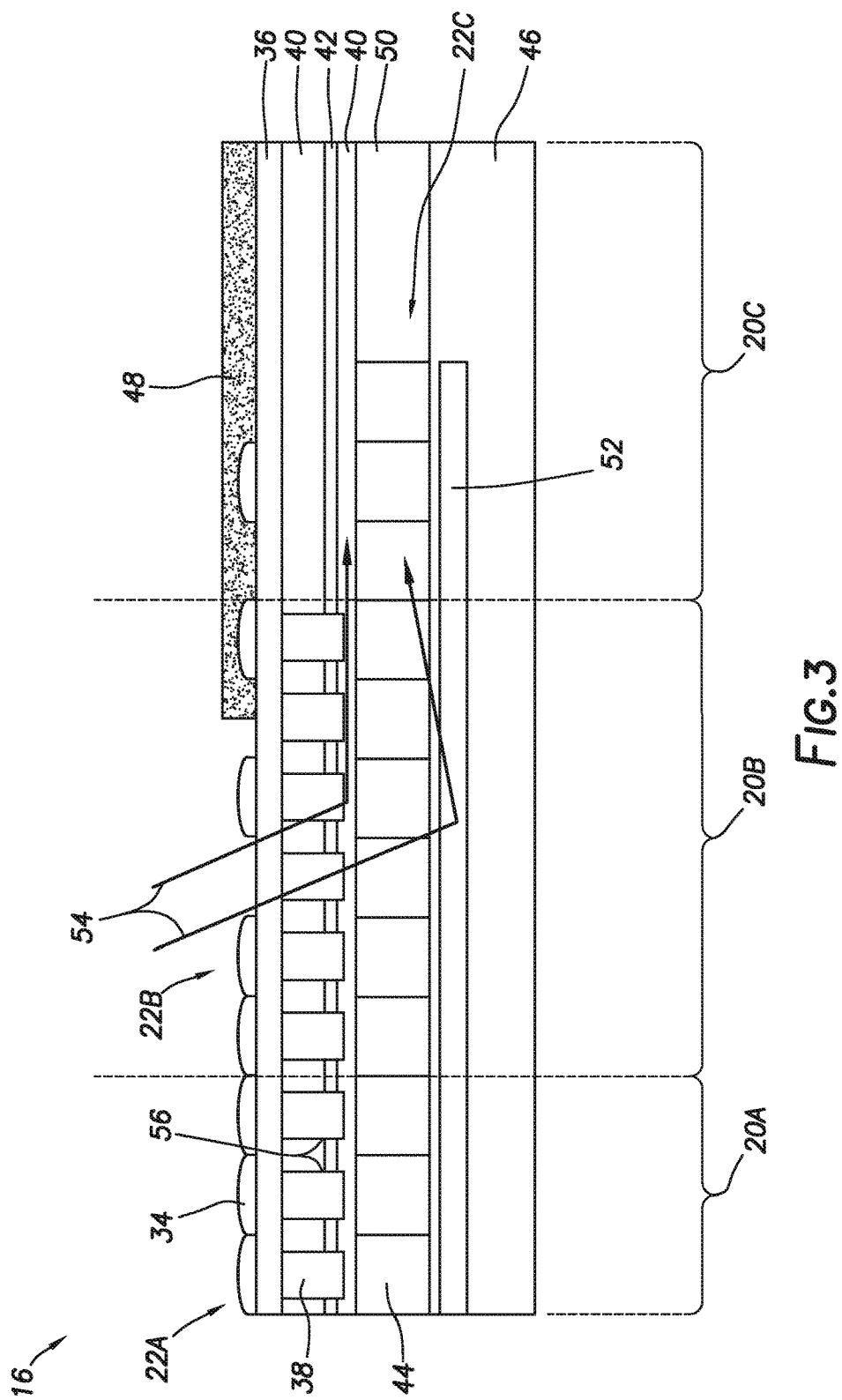
FIG. 3 is a cross-sectional side view of an illustrative image sensor having an array of image pixels, a group of dummy pixels, and a group of optically black pixels in accordance with an embodiment of the present invention.

FIG. 3 is a cross-sectional side view of an illustrative image sensor 16 of the type shown in FIG. 2. As shown in FIG. 3, pixel array 20 may have multiple regions such as active pixel array 20A (sometimes referred to herein as an image pixel array, active area, or active image pixel area), dummy pixel area 20B (sometimes referred to herein as a dummy pixel region or dummy pixel border), and an optically black pixel area 20C (sometimes referred to herein as an optically black pixel region, optically black area, or optically black border). Some portions of pixel array 20 may be formed in each of active pixel array 20A, dummy pixel area 20B, and optically black pixel area 20C. For example, pixel array 20 may include interconnect layers 46 (sometimes referred to herein as dielectric layers) formed from one or more layers of dielectric material. Metal layer 52 may form pixel structures (e.g., transfer transistors, reset transistors, row select transistors, source-follower transistors, charge storage nodes such as a floating diffusion node, pixel power supply voltage lines, ground power supply voltage lines, pixel readout lines, column output lines, etc.) in dielectric interconnect layer 46 that are electrically connected to photodiodes 44. Additional dielectric layers 40 (e.g., oxide layers, silicon oxynitride layers, hafnium oxide layers, tantalum oxide layers, etc.) may be formed over photodiodes 44. The portion of image sensor 16 in which photodiodes 44 are formed (e.g., epitaxial silicon layer 50) may be referred to herein as a photodiode layer. In some arrangements, a metal light-blocking layer 42 (sometimes referred to herein as a metal light shield) may be formed on top of dielectric layers 40 or between dielectric layers 40. Illustrative examples of materials that may be used to form metal light-blocking layer 42 include tungsten and titanium nitride. If desired, metal light-blocking layer 42 may be omitted from some or all of pixel array 20. Additional layers of dielectric material 36 (e.g., transparent dielectric material) may be formed over dielectric layers 40 and may provide a surface on which microlenses 34 (sometimes referred to herein as a microlens layer) are formed.

In some arrangements, a grid of openings 56 (sometimes referred to herein as an array of openings or color filter grid) that pass partially or completely through dielectric layers 40 (and metal light-blocking layer 42, if present) may be formed in image sensor 16. Openings 56 may be filled with colored material that forms color filter elements 38. This, however, is merely illustrative. If desired, some or all of dielectric layers 40 may be completely removed in the area of pixel array 20 in which color filters 38 are formed, such that the portions of dielectric layers 40 that are present between openings 56 in FIG. 3 are not present. In arrangements such as these, color filter material may be used to form color filter elements 38 by depositing color filter material over photodiodes 44 without the use of the grid of openings 56. Some or all of dielectric layers 40, metal light-blocking layer 42, the grid of openings 56 formed therein, and color filter elements 38 may be collectively referred to herein as a color filter layer.

Active pixel array 20A may include an array of image sensor pixels 22A. Each image sensor pixel 22A may include a photodiode 44 that generates electrical charge in response to incident light, a color filter 38 that allows light of some wavelengths to pass and reach a corresponding photodiode 44 while blocking light of other wavelengths, and a microlens 34 that focuses light incident on the image sensor 16 onto a given photodiode 44. Electrical charge generated by photodiodes 44 in active pixel area 20A may be stored and read out from image sensor 16 using pixel structures in metal layer 52 that are coupled to control and processing circuitry 24, row decoder circuitry 26, and/or column decoder circuitry 28. Electrical charge that is read out from the image sensor pixels 22A in active pixel area 20A may be used to generate digital images.

Dummy pixel area 20B may include a group of dummy pixels 22B. As shown in FIG. 3, each dummy pixel 22B may include a microlens 34, a color filter element 38 (e.g., formed in one of the openings 56), a photodiode 44, and conductive pixel structures formed in metal layer 52. If desired, one or more of these structures (e.g., a microlens 34) may be omitted in some or all of the dummy pixels 22B.

In contrast to image sensor pixels 22A in active area 20A, dummy pixels 22B may not be used for generating digital images. For example, charge generated by photodiodes 44 in dummy pixels 22B may not be read out from the array 20. In such an arrangement, photodiodes 44 may not be electrically connected to metal structures in layer 52, or metal structures in layer 52 may not be connected to readout circuitry in control and processing circuitry 24, row decoder circuitry 26, and/or column decoder circuitry 28. In another example, dummy pixels 22B may have substantially the same connections and structure as image sensor pixels 22A in active area 20A, but may receive different control and readout signals such that electrical charge generated by photodiodes 44 is not read out and/or used to generate digital images.

Optically black pixel area 20C may include a group of optically black pixels 22C. As shown in FIG. 3, optically black pixels 22C may include photodiodes 44, conductive pixel structures formed in metal layer 52, and microlenses 34. These structures may be provided for each optically black pixel 22C, or, as shown in FIG. 3, some of these structures (e.g., microlenses 34) may be provided for some but not all of optically black pixels 22C.

As shown in FIG. 3, the grid of openings 56 may not extend into optically black pixel area 20C. Instead, metal light-blocking layer 42 may extend over the photodiodes 44 in optically black pixels 22C so as to block incoming light from reaching the photodiodes 44. Image sensor 16 may also be provided with a black light shield 48 (sometimes referred to herein as an opaque light shield or black mask) over microlenses 34 and dielectric layer 36. Black light shield 48 may help to shield optically black pixels 22C from incoming light. If desired, black light shield 48 may extend into dummy pixel area 20B and overlap some of the dummy pixels 22B, as shown in FIG. 3.

Blocking incoming light from reaching optically black pixels 22C may allow optically black pixels 22C to be used to estimate or measure the dark current (e.g., current generated by photodiodes 44 even when no light is incident on the photodiode) generated by photodiodes 44 throughout the array 20. Dark current measurements from optically black pixels 22C may be used to compensate for background noise in electrical signals generated by photodiodes 44 in image pixels 22A and for performing calibration operations for image sensor 16.

Despite the presence of light-blocking structure such as light-blocking metal layer 42 and black light shield 48, light incident upon image sensor 16 may still be able to reach photodiodes 44 in optically black pixels 22C. For example, light 54 incident upon image sensor 16 in dummy pixel area 20B may reflect off of metal structures in metal layer 52 and be redirected into photodiodes 44 in optically black pixel area 20C. Light 54 reaching dummy pixel area 20B (e.g., light entering image sensor 16 at a high angle) may be reflected by dielectric layers 40 and onto photodiodes 44 in optically black pixel area 20C. This may cause photodiodes 44 in optically black pixel area 20C to generate electrical current other than dark current, providing an elevated dark current signal that can lead to improper dark current compensation and calibration operations.

While light 54 may have any wavelength, light 54 having a longer wavelength (e.g., infrared light) may reach photodiodes 44 in optically black pixel area 20C more readily than light of other wavelengths. Light of longer wavelengths penetrates more deeply into the silicon layer used to form photodiodes 44, increasing the likelihood that this light reaches metal layer 52 and is reflected back towards photodiodes 44. In image sensors that do not include infrared light filters (e.g., image sensors that may be used in automotive imaging applications), additional infrared light may reach image sensor 16 and photodiodes 44.

In order to prevent light from reaching optically black pixels 22C, additional light-blocking structures may be provided in image sensor 16. In the illustrative example of FIG. 4, dummy pixels 22B are provided with light-blocking material 58 (sometimes referred to herein as light-blocking structures, light-blocking elements, a light-blocking grid, black elements, black light-blocking elements, or black light-blocking material) that overlaps the photodiodes 44 in dummy pixel area 20B. Light-blocking material 58 may be formed in some or all of the openings 56 in dummy pixel area 20B (e.g., light-blocking material 58 may replace color filter elements 38 in dummy pixel area 20B). By providing light-blocking material 58 in the color filter layer, light incident upon image sensor 16 in dummy pixel area 20B may be prevented from reaching dielectric material through which the light can propagate to photodiodes 44 in optically black pixel area 20C and/or may be prevented from reaching metal layer 52 and reflecting back towards photodiodes 44 in optically black pixel area 20C.

Figure 5:
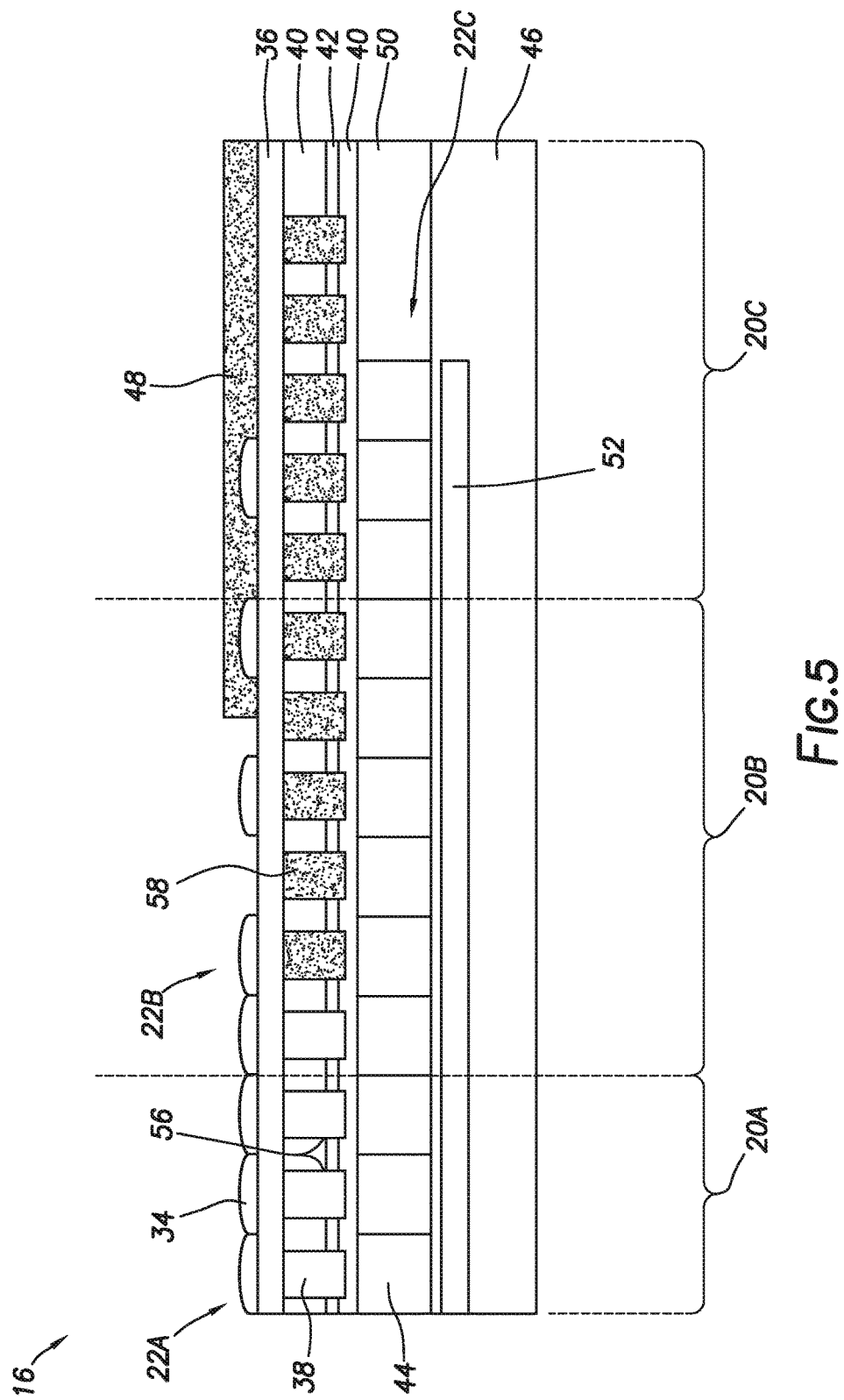
FIG. 5 is a cross-sectional side view of an illustrative image sensor having dummy pixels and optically black pixels that include light-blocking structures in accordance with an embodiment of the present invention.

In the illustrative example of FIG. 5, the grid of openings 56 may extend into optically black pixel area 20C. Openings 56 in optically black pixel area 20C may be filled with light-blocking material 58 that overlaps the photodiodes 44 of optically black pixels 22C. As shown in FIG. 5, each optically black pixel 22C may be provided with a respective light-blocking element 58. If desired, the grid of openings 56 may extend beyond the photodiodes 44 in optically black pixel area 20C such that light-blocking material 58 is formed over portions of image sensor 16 in which photodiodes 44 are not present. This, however, is merely illustrative. If desired, light-blocking material may be formed over some but not all of optically black pixels 22C in optically black pixel area 20C, and/or may be only be formed over portions of optically black pixel area 20C in which photodiodes 44 are present.

Figure 4:
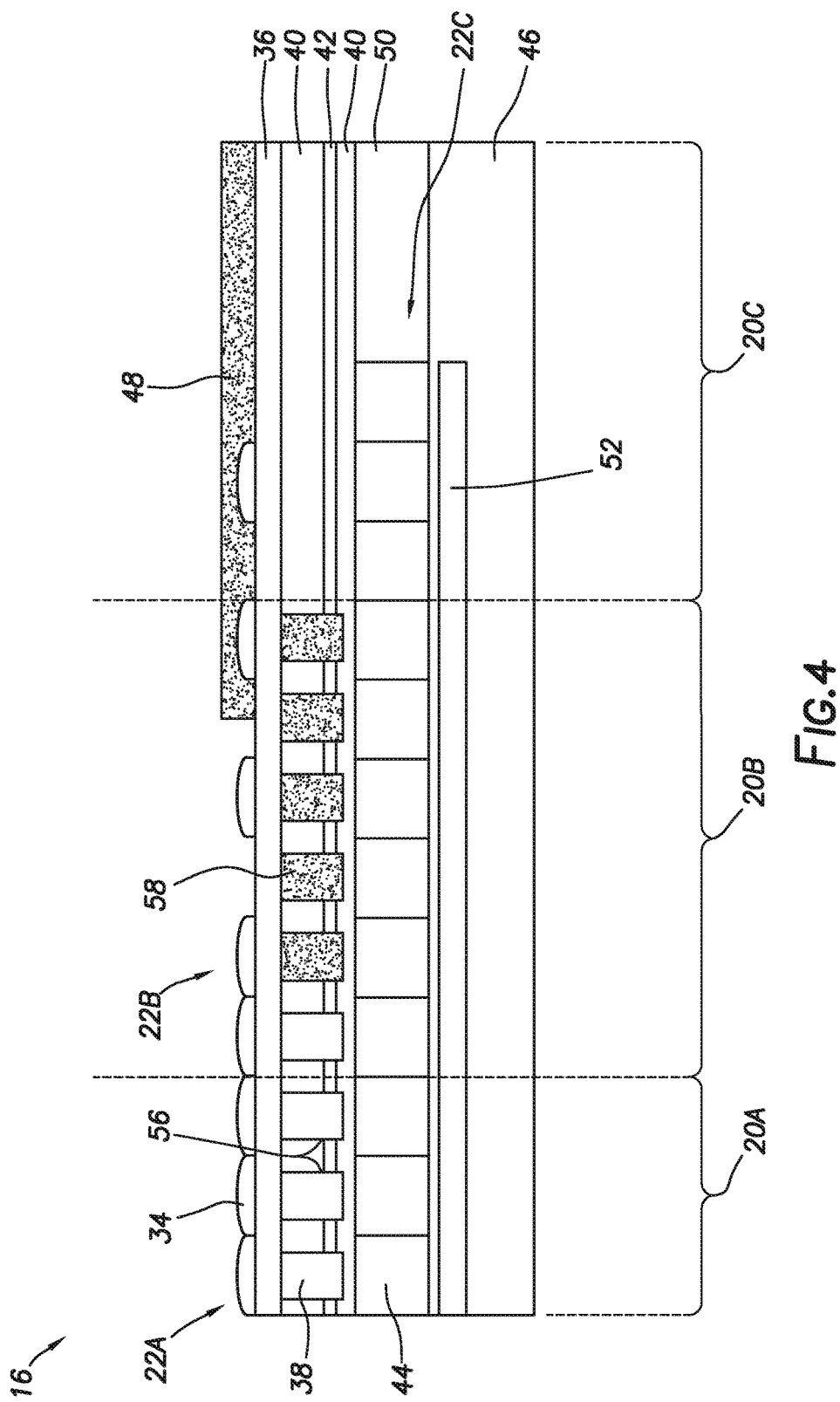
FIG. 4 is a cross-sectional side view of an illustrative image sensor having dummy pixels that include light-blocking structures in accordance with an embodiment of the present invention.
Figure 6:
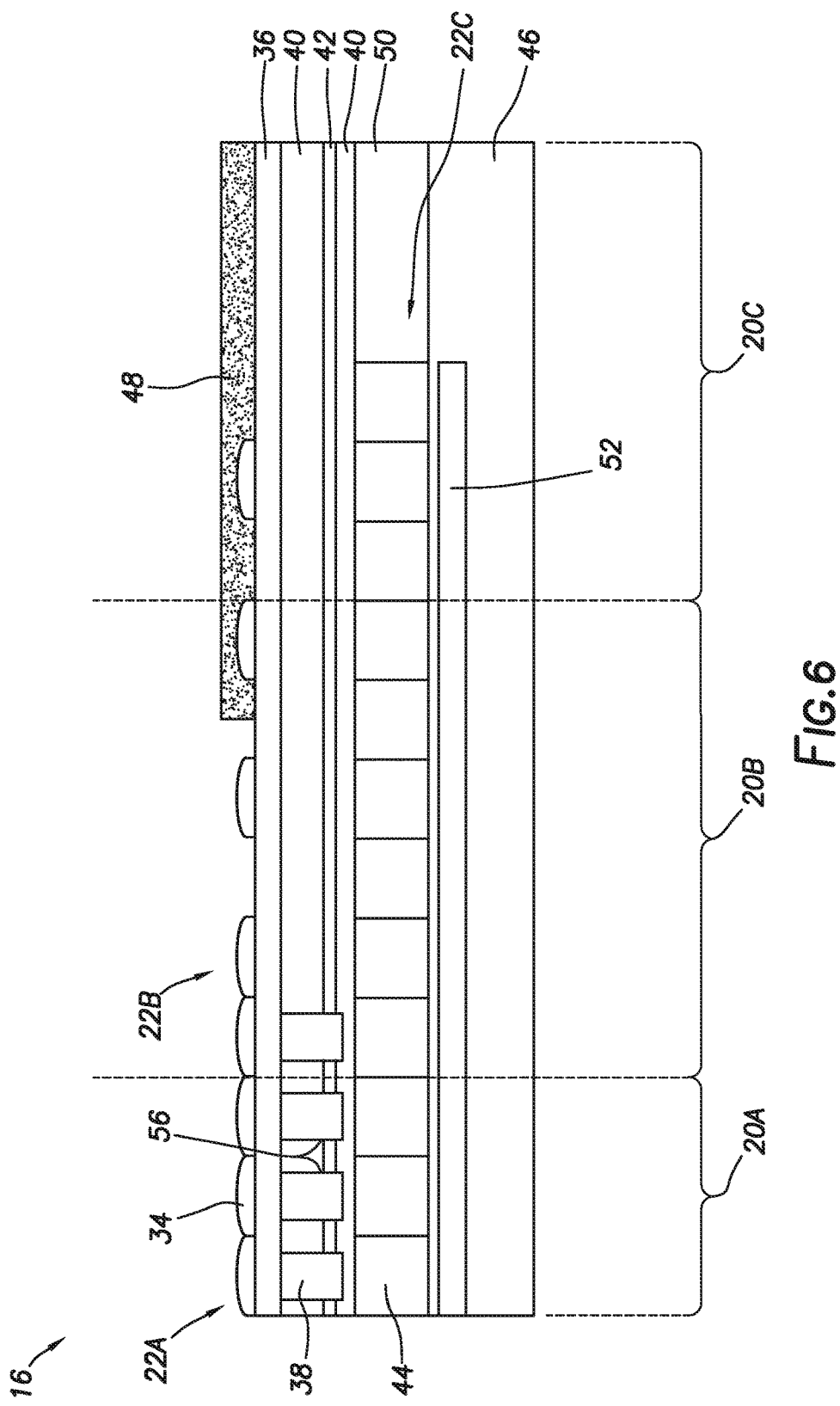
FIG. 6 is a cross-sectional side view of an illustrative image sensor having dummy pixels and optically black pixels that are covered by a metal light-blocking layer in accordance with an embodiment of the present invention.

In the illustrative example of FIG. 6, light-blocking material 58 may be omitted from dummy pixel area 20B. In such an arrangement, the openings in which light-blocking material 58 would be formed (as shown in FIG. 4, for example) may also not be present. In arrangements in which light-blocking material 58 and the openings 56 in which the light-blocking material 58 is formed are omitted, metal light shield 42 may extend uninterruptedly (continuously) into dummy pixel area 20B and over the photodiodes 44 in dummy pixels 22B. Due to the fluid dynamics of the material used for forming the color filter elements 38, it may be desirable to provide an area in the dummy pixel region 20B in which some color filter elements 38 are formed. The extra area in dummy pixel region 20B for these color filter elements 38 allows the color filter element material in the active area 20A to settle, reducing thickness variations in the active area and thereby reducing yield loss. In the arrangement shown in FIG. 6, metal light shield 42 extends into dummy pixel area 20B such that metal light shield 42 overlaps some but not all of the photodiodes 44 in dummy pixels 22B (e.g., such that at least some of the dummy pixels 22B still have a color filter 38 formed in an opening 56). Such an arrangement may allow for reduced color filter thickness variations in the active area as described above, but is merely illustrative. If desired, openings 56 may be completely omitted from dummy pixel area 20B such that metal light shield 42 covers all of the photodiodes in dummy pixel area 20B.

Figure 7:
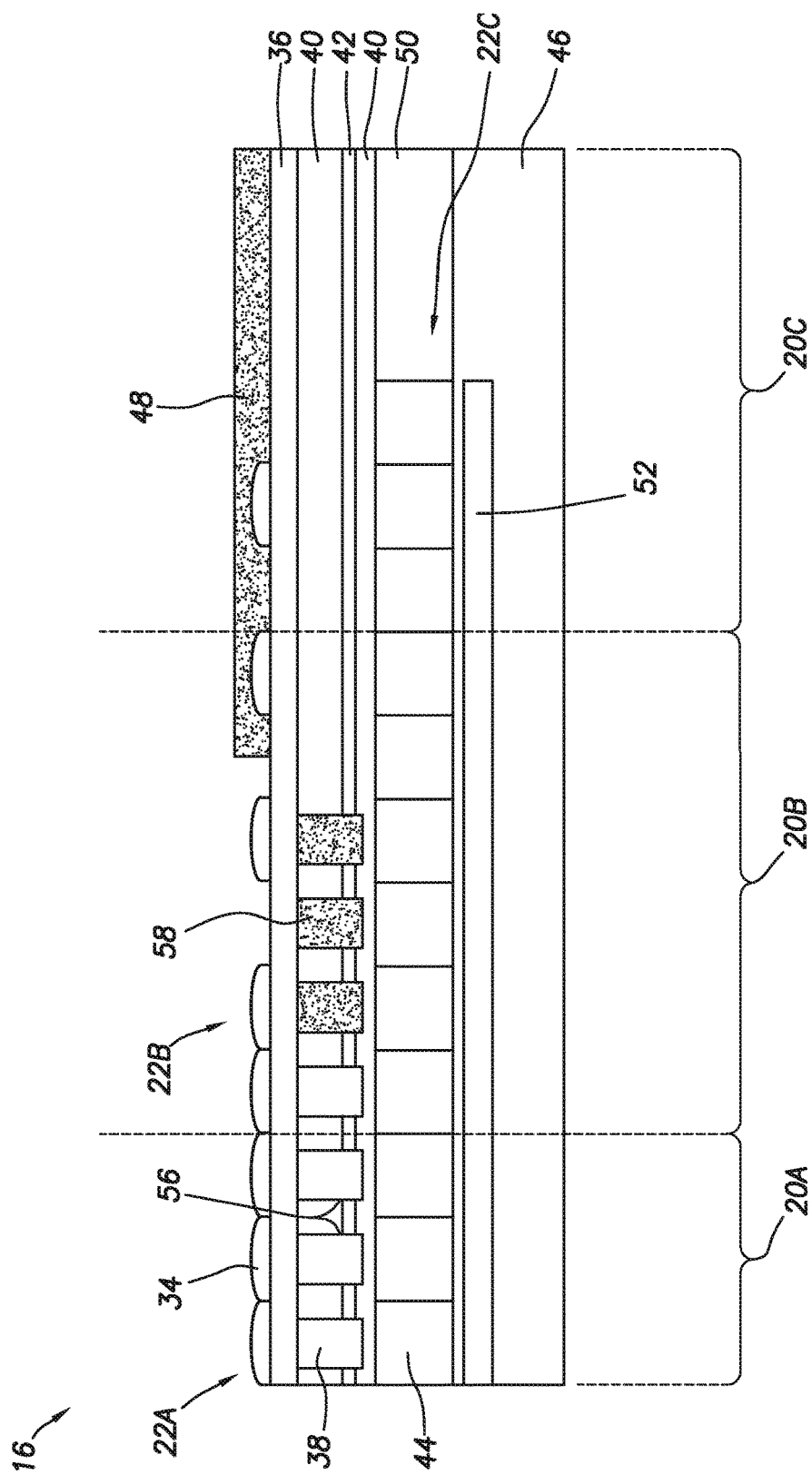
FIG. 7 is a cross-sectional side view of an illustrative image sensor having dummy pixels that are covered by a metal light-blocking layer and dummy pixels that include light-blocking structures in accordance with an embodiment of the present invention.

In the illustrative example of FIG. 7, some of the dummy pixels 22B are provided with openings 56 that are filled with light-blocking material 58. Other dummy pixels 22B are not provided with openings 56 or light-blocking material 58, and are instead overlapped by a portion of metal light shield 42 that extends continuously from optically black pixel area 20C into dummy pixel area 20B. As shown in FIG. 7, some of the dummy pixels 22B are provided with openings 56 having a color filter element 38 formed therein. This, however, is merely illustrative. If desired, all of the dummy pixels 22B in dummy pixel area 20B may be provided with a light-blocking structure such as light-blocking material 58 or metal light shield 42, such that none of the dummy pixels 22B in dummy pixel area 20B may include color filter elements 38. In arrangements such as this, the number of dummy pixels 22B that are covered by light-blocking material 58 and the number of dummy pixels 22B that are covered by metal light shield 42 may be provided in any suitable combination.

Figure 8:
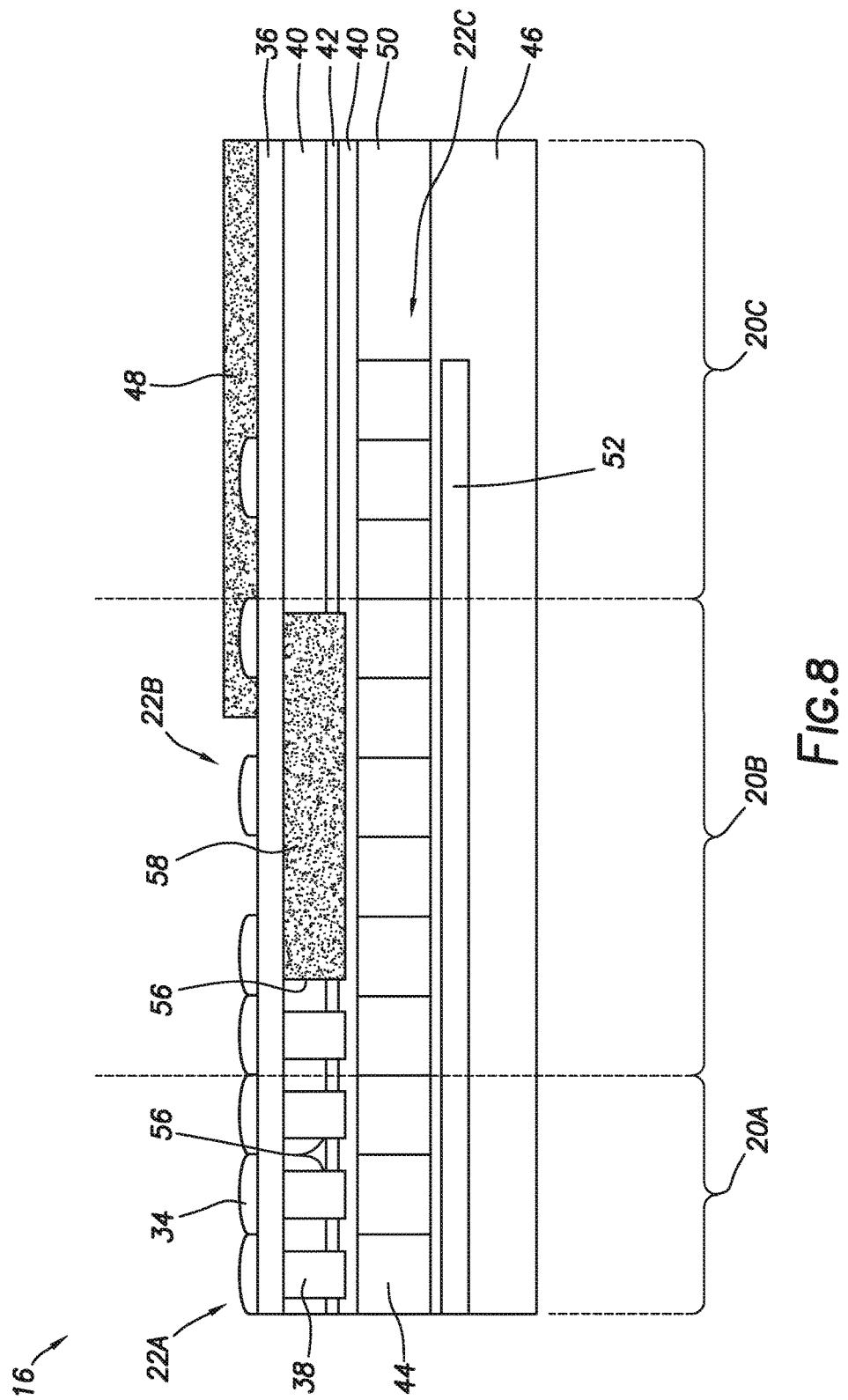
FIG. 8 is a cross-sectional side view of an illustrative image sensor having dummy pixels that include a single light-blocking structure that overlaps multiple dummy pixel photodiodes in accordance with an embodiment of the present invention.

In the illustrative example of FIG. 8, the grid includes a single opening 56 that overlaps multiple photodiodes 44 in multiple dummy pixels 22B. A single light-blocking element 58 is formed in the opening 56 so as to overlap the multiple photodiodes 44 of multiple dummy pixels 22B. In this way, image sensor 16 may be provided with an in-array opaque border (sometimes referred to herein as a black border or light-blocking border) that surrounds the active pixel area 20A. In the arrangement of FIG. 8, at least one of the dummy pixels 22B is provided with a separate opening 56 in which a color filter element 38 is formed. This, however, is merely illustrative. If desired, more than one of the dummy pixels 22B may be provided with a separate opening 56 in which a color filter element 38 is formed, while a single opening 56 and a single light-blocking element 58 that overlap multiple photodiodes 44 in multiple dummy pixels 22B is also provided. If desired, none of the dummy pixels 22B may be provided with a separate opening 56 in which a color filter element 38 is formed, and a single opening 56 with a single light-blocking element 58 may overlap all of the photodiodes 44 in dummy pixel area 20B. If desired, dummy pixel area 20B may include multiple openings that each overlap a different respective group of multiple photodiodes for dummy pixels 22B. Each opening of this type may include a single light-blocking element that overlaps the multiple photodiodes of one of the respective groups.

Figure 9:
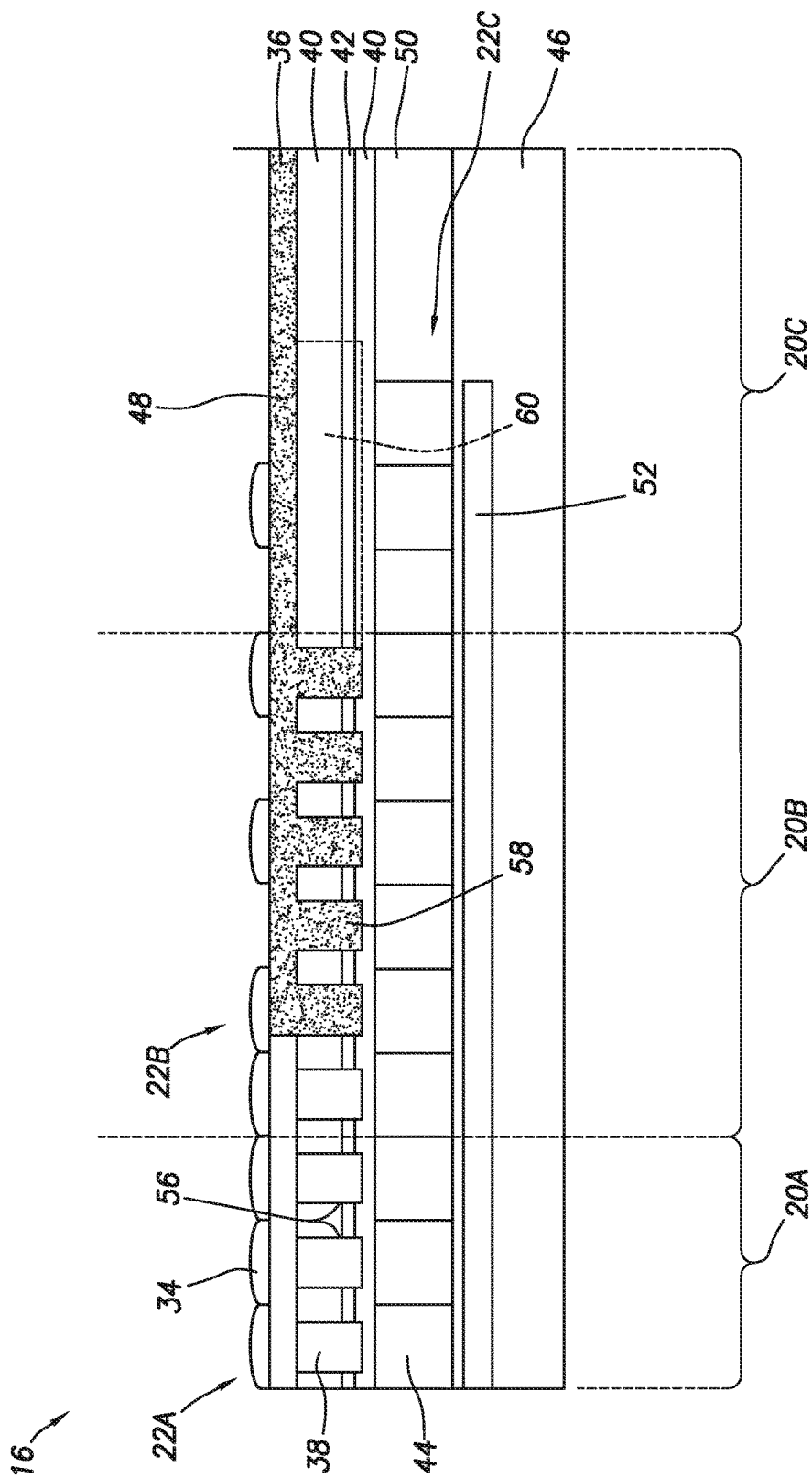
FIG. 9 is a cross-sectional side view of an illustrative image sensor having dummy pixels with light-blocking structures that extend over a group of optically black pixels to form a black light shield in accordance with an embodiment of the present invention.

In the illustrative example of FIG. 9, light-blocking elements 58 and black light shield 48 are combined to form a single light-blocking element. In such an example, openings 56 in dummy pixel area 20B are filled with light-blocking material 58. This light-blocking material extends above the color filter layer to the level of dielectric layer 36, and then extends into optically black pixel area 20C to form black light shield 48. In order to allow the light-blocking material to form light-blocking elements 58 and black light shield 48 in a single manufacturing step, black light shield 48 may be formed underneath microlenses 34 (as opposed to being formed on top of microlenses 34 as shown in FIG. 3). Although FIG. 9 shows that there are some dummy pixels 22B over which the single light-blocking structure is not formed, this is merely illustrative. If desired, each dummy pixel 22B may have a light-blocking element 58 formed thereover that projects above the opening 56 to form black light shield 48.

In the example of FIG. 9, light-blocking elements 58 are formed in dummy pixel area 20B but not in optically black pixel area 20C. This is merely illustrative. If desired, the grid of openings 56 and light-blocking material 58 formed in the openings may extend into region 60 (as shown, for example, in FIG. 5). Light-blocking material 58 formed in optically black pixel area 20C in this way may project above the openings 56 to form black light shield 48 in the same was as light-blocking material 58 in dummy pixel area 20B.

Figure 10:
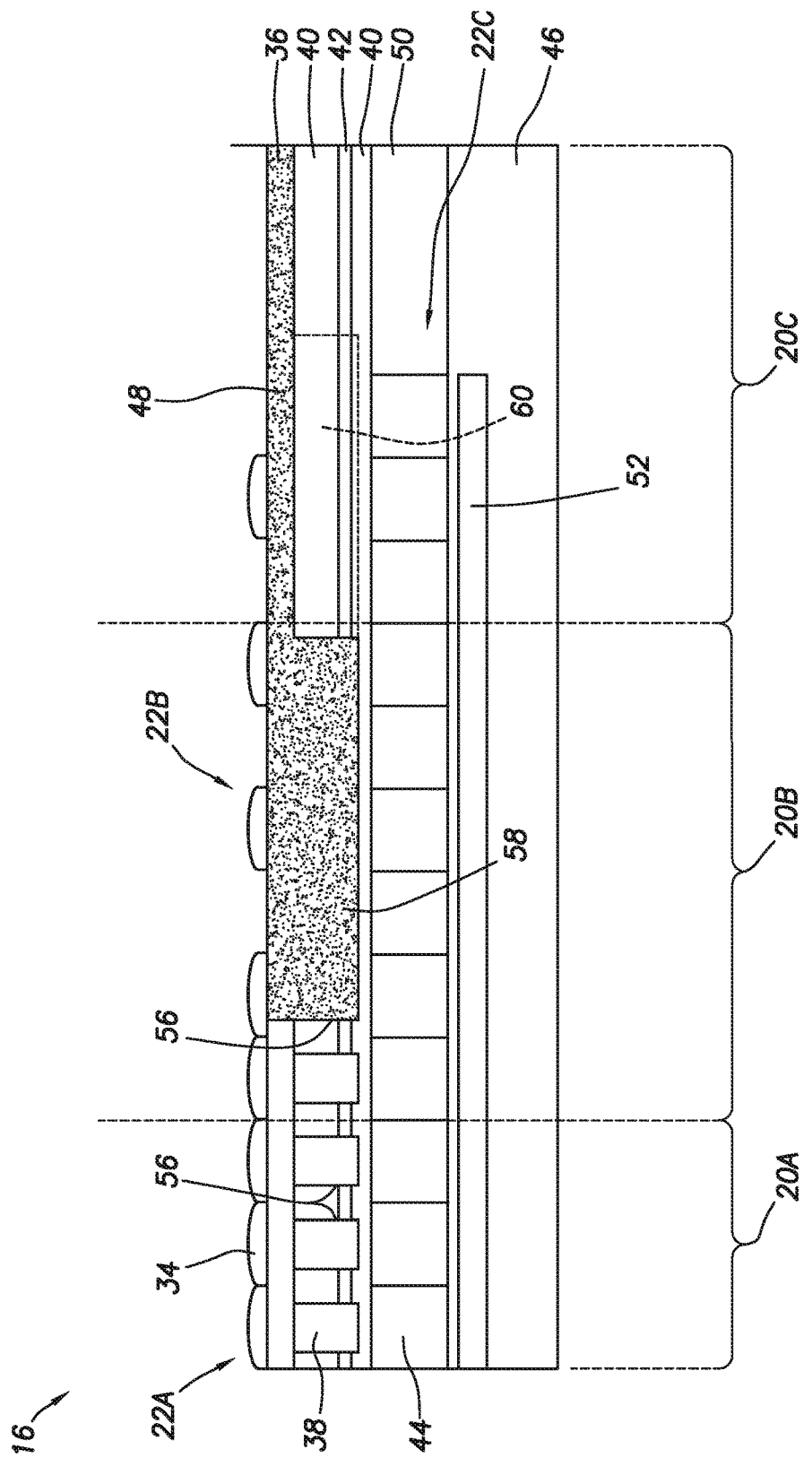
FIG. 10 is a cross-sectional side view of an illustrative image sensor having a light-blocking structure that overlaps the photodiodes of multiple dummy pixels and that extends over a group of optically black pixels to form a black light shield in accordance with an embodiment of the present invention.

In the illustrative example of FIG. 10, black light shield 48 and a single light-blocking element 58 that is formed in a single opening 56 so as to overlap multiple photodiodes 44 in multiple dummy pixels 22B (as shown in FIG. 8, for example) are combined to form a single light-blocking element. In such an example, the single opening 56 in dummy pixel area 20B is filled with light-blocking material 58. This light-blocking material projects out of the single opening and the color filter layer to the level of dielectric layer 36, and then extends into optically black pixel area 20C to form black light shield 48. In order to allow the light-blocking material to form a single light-blocking element 58 and black light shield 48 in a single manufacturing step, black light shield 48 may be formed underneath microlenses 34 (as opposed to being formed on top of microlenses 34 as shown in FIG. 3). Although FIG. 10 shows that there are some dummy pixels 22B over which the single light-blocking structure is not formed, this is merely illustrative. If desired, each dummy pixel 22B may be covered by the single light-blocking element 58 that projects above the single opening 56 to form black light shield 48.

In the example of FIG. 10, single light-blocking element 58 is formed in dummy pixel area 20B but not in optically black pixel area 20C. This is merely illustrative. If desired, the single opening 56 and light-blocking material 58 formed in the opening may extend into region 60 to overlap photodiodes 44 in optically black pixels 22C. Light-blocking material 58 formed in optically black pixel area 20C in this way may project above the opening 56 to form black light shield 48 in the same was as light-blocking material 58 in dummy pixel area 20B. If desired, the single light-blocking structure formed from light-blocking material 58 and black light shield 48 may extend over all of optically black pixel area 20C. In an arrangement such as this, metal light-blocking layer 42 may be omitted from optically black pixel area 20C or from pixel array 20 (e.g., all of active area 20A, dummy pixel area 20B, and optically black pixel area 20C) entirely.

In the examples of FIGS. 3-10 described above, metal light-blocking layer 42 is shown as being present in at least some portions of each of active area 20A, dummy pixel area 20B, and optically black pixel area 20C. This, however, is merely illustrative. If desired, metal light-blocking layer 42 may be formed only in optically black pixel area 20C, and omitted from dummy pixel area 20B and active area 20A. An arrangement in which light-blocking layer 42 is formed only in optically black pixel area 20C and omitted from dummy pixel area 20B and active area 20A may include a grid of openings 56, light-blocking element(s) 58, and/or black light shield 48 of the type shown in FIGS. 3-10.

In some arrangements, the grid of openings 56 may be omitted entirely (e.g., dielectric layers 40 may be completely removed in the area of pixel array 20 in which color filters 38 and light-blocking elements 58 are formed, such that the portions of dielectric layers 40 that are present between openings 56 in FIGS. 3-10 are not present). In arrangements such as these, color filter material may be used to form color filter elements 38 by depositing color filter material over photodiodes 44 without the use of the grid of openings 56. Light-blocking material 58 may be used to form light-blocking structures such as those shown in FIGS. 8 and 10 (e.g., a single light-blocking structure that overlaps multiple photodiodes 44 in dummy pixel area 20B and/or optically black pixel area 20C) by depositing light-blocking material 58 over photodiodes 44 without the use of the grid of openings 56. In arrangements such as this, metal light shield 42 may be formed in a portion or the entirety of each of active area 20A, dummy pixel area 20B, and optically black pixel area 20C, may be formed in optically black pixel area 20C and omitted from active area 20A and dummy pixel area 20B, or may be omitted from pixel array 20 as a whole.

In general, suitable materials for light-blocking material 58 and black light shield 48 include materials that block some or all of the component wavelengths of the light that an image sensor 16 may receive. For example, light-blocking material 58 and/or black light shield 48 may be formed of materials that block some or all of the ultraviolet wavelengths (e.g., approximately 10 nm to 400 nm), some or all of the wavelengths in the visible spectrum (e.g., approximately 390 nm to 700 nm), some of all of the infrared wavelengths (e.g., approximately 700 nm to 1 mm), all of these wavelengths, or any combinations of these wavelengths. Light-blocking material 58 and/or black light shield 48 may be opaque (i.e., may not allow any light to pass). In some arrangements, materials that block infrared light, visible light, or some combination of the two (sometimes referred to herein as a VIS+IR blocking material) may be used to block wavelengths of light that are most likely to reach photodiodes 44 in optically black pixels 22C.

Materials that may provide light-blocking properties such as those described above may include organic materials, inorganic materials, and combinations of organic and inorganic materials. These materials may have light-blocking particles such as carbon, metal, and/or silicon embedded therein. If desired, a light-blocking metal may be used alone or in combination with other materials in light-blocking structures 58 and black light shield 48. If desired, combinations of dielectric material and/or metal material (e.g., metal particles embedded in a dielectric carrier) may be used to form light-blocking structures 58 and/or black light shield 48.

Although FIGS. 3-10 are described above in the context of a backside-illuminated image sensor (i.e., metal layer 52 is beneath the photodiodes 44 such that light does not pass through metal layer 52 before reaching photodiodes 44), this is merely illustrative. If desired, arrangements of the types described above in connection with FIGS. 3-10 may be implemented in a frontside-illuminated image sensor in which metal layer 52 is between photodiodes 44 and color filter elements 48 (i.e., light must pass through metal layer 52 to reach photodiodes 44).

Figure 11:
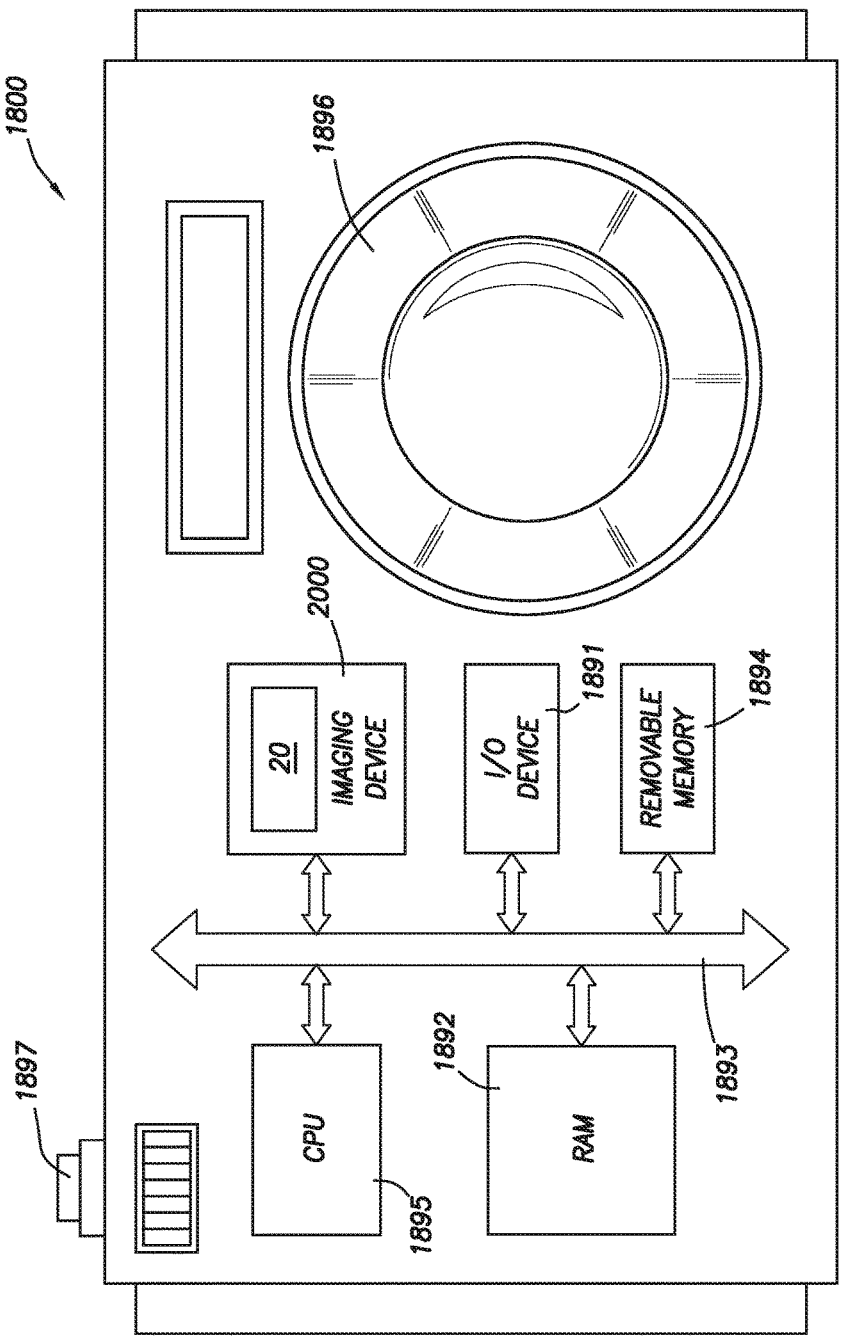
FIG. 11 is a block diagram of an illustrative processor system employing the embodiments of FIGS. 1-10 in accordance with an embodiment of the present invention.

FIG. 11 shows in simplified form a typical processor system 1800, such as a digital camera, which includes an imaging device 2000 (e.g., an imaging device 2000 such as image sensor 16 of FIGS. 1-10 employing optically black pixels with light-blocking structures). The processor system 1800 is exemplary of a system having digital circuits that could include imaging device 2000. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

The processor system 1800 generally includes a lens 1896 for focusing an image on pixel array 100 of device 2000 when a shutter release button 1897 is pressed, central processing unit (CPU) 1895, such as a microprocessor which controls camera and one or more image flow functions, which communicates with one or more input/output (I/O) devices 1891 over a bus 1893. Imaging device 2000 also communicates with the CPU 1895 over bus 1893. The system 1800 also includes random access memory (RAM) 1892 and can include removable memory 1894, such as flash memory, which also communicates with CPU 1895 over the bus 1893. Imaging device 2000 may be combined with the CPU, with or without memory storage on a single integrated circuit or on a different chip. Although bus 1893 is illustrated as a single bus, it may be one or more busses or bridges or other communication paths used to interconnect the system components.

In accordance various embodiments, an image sensor may have an active pixel array, an optically black pixel area, and a dummy pixel area interposed between the active pixel array and the optically black pixel area. The image sensor may include a photodiode layer having photodiodes in the active pixel array, the optically black pixel area, and the dummy pixel area, and a color filter layer that overlaps the photodiode layer. The color filter layer may include color filter elements in the active pixel array that pass light to the photodiodes in the active pixel array and light-blocking structures that overlap the photodiodes in the dummy pixel area and prevent light from passing through the color filter layer in the dummy pixel area.

The color filter layer may include a dielectric layer having an array of openings that overlaps the active pixel array and the dummy pixel area. The color filter elements may be formed in the openings that overlap the active pixel array and the light-blocking structures may be formed in the openings that overlap the dummy pixel area. The array of openings may overlap the optically black pixel area. Light-blocking structures may be formed in the openings that overlap the optically black pixel area.

The image sensor may include a microlens layer comprising microlenses that overlap the photodiodes in the active pixel array, the optically black pixel area, and the dummy pixel area. The color filter layer may be interposed between the microlens layer and the photodiode layer.

The image sensor may include a black mask that is formed over the microlens layer in the optically black pixel area and the dummy pixel area. The light-blocking structures in the openings in the dummy pixel area may extend above the dielectric layer and extend into the optically black pixel area to form a black mask interposed between the microlens layer and the dielectric layer. The openings in the dummy pixel area may include a single opening that overlaps multiple photodiodes in the dummy pixel area. The light-blocking structures may include a single light-blocking structure that extends above the dielectric layer and into the optically black pixel area to form a black mask interposed between the microlens layer and the dielectric layer. The single opening and the single light-blocking structure may extend into the optically black pixel area and overlap the photodiodes in the optically black pixel area. Each of the color filter elements in the active pixel array may overlap a corresponding one of the photodiodes in the active pixel array. The light-blocking structures may include a single light-blocking element that overlaps multiple photodiodes in the dummy pixel area.

The image sensor may include a metal light-blocking layer that overlaps the photodiodes in the optically black pixel area. The metal light-blocking layer may extend into the dummy pixel area and form light-blocking structures. The light-blocking structures may overlap a first group of photodiodes in the dummy pixel area. The metal light-blocking layer may extend into the dummy pixel area and overlap a second group of photodiodes that is different than the first group of photodiodes.

In accordance with various embodiments, a pixel array may have an active area, a dummy pixel area, and an optically black pixel area. The pixel array may include a silicon layer in which an array of photodiodes is formed, dielectric layers formed over the silicon layer, a grid of openings that extend through the dielectric layers and each overlap a photodiode in the array, color filters formed in the openings in the active area that transmit light to the photodiodes in the active area, and light-blocking material formed in the openings in the dummy pixel area. The light-blocking material may block light from passing through the grid of openings in the dummy pixel area. The dummy pixel area may be interposed between the active area and the optically black pixel area.

The pixel array may include a metal light-blocking shield between two of the dielectric layers. The metal light-blocking shield may overlap the photodiodes in the optically black pixel area. The openings may extend through the metal light-blocking layer in the active area and in the dummy pixel area. The metal light-blocking shield may extend into the dummy pixel area and overlap some of the photodiodes in the dummy pixel area. Each opening in the active area may overlap a single photodiode. The openings in the dummy pixel area may include a single opening filled with light-blocking material that overlaps multiple photodiodes.

In accordance with various embodiments, a system may include a central processing unit, memory, input-output circuitry, and an image sensor. The image sensor may include a pixel array comprising an active area, a dummy pixel area, and an optically black pixel area, a layer of silicon that forms photodiodes in the active area, the dummy pixel area, and the optically black pixel area, a dielectric layer that overlaps the layer of silicon in in the active area, the dummy pixel area, and the optically black pixel area, and a grid of openings in the active area and the dummy pixel area. Each opening in the grid may overlap a corresponding one of the photodiodes in the layer of silicon. Color filter elements may be formed in the openings that overlap the photodiodes in the active area. Light-blocking elements may be formed in the openings that overlap the photodiodes in the dummy pixel area and may include infrared light-blocking material that blocks light that enters the image sensor through the dummy pixels from reaching the optically black pixel area. The grid of openings may extend into the optically black pixel area. The light-blocking elements may be formed in the openings that overlap the photodiodes in the optically black pixel area.

The system may include a metal light-blocking layer that is formed in the dielectric layer and that is separate from the light-blocking elements. The metal light-blocking layer may cover the photodiodes in the optically black pixel area. The grid of openings may extend through the metal light-blocking layer in the active area and the dummy pixel area.

The system may include a black light shield that is formed over the optically black pixel area. The metal light-blocking layer may be interposed between the photodiodes in the optically black pixel area and the black light shield.

The foregoing is merely illustrative of the principles of this invention and various modifications can be made by those skilled in the art. The foregoing embodiments may be implemented individually or in any combination.

What is claimed is:

1. An image sensor having an active pixel array, an optically black pixel area, and a dummy pixel area interposed between the active pixel array and the optically black pixel area, the image sensor comprising:
   a photodiode layer comprising:
     photodiodes in the active pixel array, the optically black pixel area, and the dummy pixel area; and
   a color filter layer that overlaps the photodiode layer, the color filter layer comprising:
     color filter elements in the active pixel array that pass light to the photodiodes in the active pixel array; and
     light-blocking structures that overlap the photodiodes in the dummy pixel area and prevent light from passing through the color filter layer in the dummy pixel area, wherein each of the color filter elements in the active pixel array overlaps a corresponding one of the photodiodes in the active pixel array, and wherein the light-blocking structures comprise a single light-blocking element that overlaps multiple photodiodes in the dummy pixel area.

2. The image sensor defined in claim 1, wherein the color filter layer comprises a dielectric layer having an array of openings that overlaps the active pixel array and the dummy pixel area, wherein the color filter elements are formed in the openings that overlap the active pixel array and wherein the single light-blocking element is formed in at least one opening that overlaps the dummy pixel area.

3. The image sensor defined in claim 2,
   wherein the array of openings overlaps the optically black pixel area, and wherein the light-blocking structures are formed in the openings that overlap the optically black pixel area.

4. The image sensor defined in claim 2, further comprising:
   a microlens layer comprising microlenses that overlap the photodiodes in the active pixel array, the optically black pixel area, and the dummy pixel area, wherein the color filter layer is interposed between the microlens layer and the photodiode layer.

5. The image sensor defined in claim 4, further comprising:
   a black mask that is formed over the microlens layer in the optically black pixel area and the dummy pixel area.

6. The image sensor defined in claim 4, wherein the light-blocking structures that overlap the photodiodes in the dummy pixel area extend above the dielectric layer and extend into the optically black pixel area to form a black mask interposed between the microlens layer and the dielectric layer.

7. The image sensor defined in claim 4, wherein the at least one opening comprises a single opening that overlaps multiple photodiodes in the dummy pixel area and wherein the single light-blocking element extends into the optically black pixel area to form a black mask interposed between the microlens layer and the dielectric layer.

8. The image sensor defined in claim 7, wherein the single opening and the single light-blocking element extend into the optically black pixel area and overlap the photodiodes in the optically black pixel area.

9. The image sensor defined in claim 1, further comprising:
   a metal light-blocking layer that overlaps the photodiodes in the optically black pixel area.

10. The image sensor defined in claim 9, wherein the metal light-blocking layer extends into the dummy pixel area and forms the light-blocking structures.

11. The image sensor defined in claim 9, wherein the light-blocking structures overlap a first group of photodiodes in the dummy pixel area, and wherein the metal light-blocking layer extends into the dummy pixel area and overlaps a second group of photodiodes in the dummy pixel area that is different than the first group of photodiodes.

12. The image sensor defined in claim 1, wherein the single light-blocking element comprises an integral structure that extends into the optically black pixel area and is formed between a microlens layer and the color filter layer at the optically black pixel area.

13. A pixel array having an active area, a dummy pixel area, and an optically black pixel area, the pixel array comprising:
   a silicon layer in which an array of photodiodes is formed;
   dielectric layers formed over the silicon layer;
   a grid of openings that extend through the dielectric layers, wherein each of the openings overlaps a photodiode in the array;
   color filters formed in the openings in the active area, wherein the color filters transmit light to the photodiodes in the active area; and
   light-blocking material formed in the openings in the dummy pixel area, wherein the light-blocking material blocks light from passing through the grid of openings in the dummy pixel area.

14. The pixel array defined in claim 13, wherein the dummy pixel area is interposed between the active area and the optically black pixel area.

15. The pixel array defined in claim 14, further comprising:
   a metal light-blocking shield interposed between two of the dielectric layers, wherein the metal light-blocking shield overlaps the photodiodes in the optically black pixel area, and wherein the openings extend through the metal light-blocking shield in the active area and in the dummy pixel area.

16. The pixel array defined in claim 15, wherein the metal light-blocking shield extends into the dummy pixel area overlaps some of the photodiodes in the dummy pixel area.

17. The pixel array defined in claim 14, wherein each opening in the active area overlaps a single photodiode, and wherein the openings in the dummy pixel area comprise a single opening that is filled with the light-blocking material and that overlaps multiple photodiodes.

18. A system, comprising:
a central processing unit;
memory;
input-output circuitry; and
an image sensor comprising:
   a pixel array comprising an active area, a dummy pixel area, and an optically black pixel area;
   a layer of silicon that forms photodiodes in the active area, the dummy pixel area, and the optically black pixel area;
   a dielectric layer that overlaps the layer of silicon in the active area, the dummy pixel area, and the optically black pixel area;
   a plurality of openings in the active area and the dummy pixel area, wherein each opening in the plurality of openings overlaps a corresponding one of the photodiodes in the layer of silicon;
   color filter elements formed in the openings that overlap the photodiodes in the active area; and
   light-blocking elements formed in the openings that overlap the photodiodes in the dummy pixel area, wherein the light-blocking elements formed in the openings that overlap the photodiodes in the dummy pixel area comprise infrared light-blocking material and block light that enters the image sensor through the dummy pixels from reaching the optically black pixel area.

19. The system defined in claim 18, wherein the plurality of openings extend into the optically black pixel area, and wherein the light-blocking elements are formed in the openings that overlap the photodiodes in the optically black pixel area.

20. The system defined in claim 18, further comprising:
a metal light-blocking layer that is formed in the dielectric layer and that is separate from the light-blocking elements, wherein the metal light-blocking layer covers the photodiodes in the optically black pixel area, and wherein the plurality of openings extend through the metal light-blocking layer in the active area and the dummy pixel area; and
a black light shield that is formed over the optically black pixel area, wherein the metal light-blocking layer is interposed between the photodiodes in the optically black pixel area and the black light shield.

* * * * *